United States Patent [19]

Kubo et al.

[11] Patent Number: 4,772,862

[45] Date of Patent: Sep. 20, 1988

[54] FILTER APPARATUS

[75] Inventors: Kazuhiko Kubo, Mishima; Akira Usui, Takatsuki; Hiroyuki Nagai, Ibaraki; Hideyuki Miyake, Matsubara; Takashi Fujino, Izumi, all of Japan

[73] Assignee: Matsushita Electric Industrial Co., Ltd., Kadoma, Japan

[21] Appl. No.: 942,485

[22] Filed: Dec. 16, 1986

[30] Foreign Application Priority Data

Dec. 17, 1985 [JP] Japan ................ 60-283524

[51] Int. Cl.$^4$ ............................................. H03H 7/01
[52] U.S. Cl. .................... 333/167; 333/184; 333/185; 333/204
[58] Field of Search ................ 333/167, 168, 181–185, 333/12, 175–177, 202, 204, 205; 361/395–398, 400, 402, 409, 424

[56] References Cited

U.S. PATENT DOCUMENTS 2,076,248  4/1937  Norton ................ 333/129
2,688,119  8/1954  Gere .................. 361/424 X
3,991,347  11/1976 Hollyday ............... 361/400

FOREIGN PATENT DOCUMENTS 7823224  11/1978  Fed. Rep. of Germany .
7832587  3/1980   Fed. Rep. of Germany .

Primary Examiner—Marvin L. Nussbaum
Attorney, Agent, or Firm—Cushman, Darby & Cushman

[57] ABSTRACT

On an upper surface of a substrate (20) a band-pass filter (29) is provided, and on the opposite (lower) surface of a substrate (20) a low-pass filter comprising a conductive layer pattern (27) and capacitors (22,23) is provided, wherein a conductive layers (27) are provided on substantially the entire area of the upper surface excluding portions for terminals and on the lower surface excluding portions for the low-pass filter and the terminals, and by connecting both conductive layers by means of a row of through-hole connections, the input terminal (24) and the output terminal (25) are shielded from each other.

8 Claims, 9 Drawing Sheets

FILTER APPARATUS

FIELD OF THE INVENTION AND RELATED ART STATEMENT

1. Field of the Invention

The present invention relates generally to a filter apparatus, and in particular to a filter apparatus suitable for coupling an up-converter and a down-converter in a tuner or a CATV (cable television) converter of double super heterodyne type.

2. Description of the Related Art

In recent years, CATV converters of the up-down type have been sold. In such CATV converters, a low-pass filter and a band-pass filter are connected between an up-converter and a down-converter.

FIG. 1 is a block diagram of a prior art CATV converter, for example, published unexamined patent applications No. Sho 58-31622, No. Sho 59-81925). A signal applied to an input terminal A is led through an input filter 1. Output from the input filter 1 is converted into a first intermediate frequency by a mixing circuit 2. The converted signal is led through a low-pass filter 4 and band-pass filter 5, and is amplified by a first intermediate frequency amplifier 6. Output from the first intermediate frequency amplifier 6 is converted into a second intermediate frequency, which is lower than the first intermediate frequency, by a mixing circuit 7. The converted signal is led through a second intermediate frequency amplifier 9 and is applied to an output terminal B.

The input filter 1, the mixing circuit 2 and the first local oscillator 3 form an up-convert C. The first intermediate frequency amplifier 6, the mixing circuit 7, the second local oscillator 8 and the second intermediate frequency amplifier 9 form a down-convert D. The low-pass filter 4 and the band-pass filter 5 are provided between the up-convert C and the down-convert D.

FIG. 2A is a plan view of the low-pass filter 4 and the band-pass filter 5, FIG. 2B is a circuit diagram of the low-pass and band-pass filters 4, 5 and FIG. 2C is a sectional view of the low-pass filter 4 and the band-pass filter 5. The band-pass filter 5 is provided on the substrate 10. The low-pass filter 4 consists of capacitors 12, 14 and a coreless-coil 13. The coreless-coil 13 is enclosed in a shield plate 15. Output of the low-pass filter 4 is connected to a connecting lead 16, which is further connected to an input terminal of the band-pass filter 5 through a conductive layer 17. The low-pass filter 4 has a characteristic as shown in FIG. 3A and the band-pass filter 5 has a characteristic as shown in FIG. 3B. A combination characteristic of the low-pass filter 4 and the band-pass filter 5 is shown in FIG. 3C.

In a conventional filter apparatus, there is a problem that spurious interference can take place through interference between a differential component of local oscilation frequencies of the first and second local oscilators 3, 8 and higher harmonic frequencies. The low-pass filter 4 is provided for removing the local oscilation frequency. The band-pass filter 5 is provided for preventing cross modulation etc. by removing signals of unnecessary channels.

In such a conventional filter apparatus, the low-pass filter 4 must be enclosed in a shield plate 15, and winding and soldering operations of the coreless-coil 13 and the capacitors 12, 14 must be carried out in a manner so as to be isolated above the substrate 20. Therefore, complex steps are necessary for production. Further, greater area is necessary, because the low-pass filter 4 and the band-pass filter 5 are separately provided.

If both filters 4, 5 are provided on one substrate or no shield plate 15 is provided, a higher harmonic frequency signal to be inputted to the low-pass filter 4 is led directly to the output terminal of the band-pass filter 5. Therefore, the performance of the filter apparatus is degraded.

OBJECT AND SUMMARY OF THE INVENTION

It is a purpose of the present invention to provide a filter apparatus which can save space and which can be produced is a few simple steps.

A filter apparatus in accordance with the present invention comprises;

a substrate of insulating material, a low-pass filter having at least one capacitor provided on a first surface of the substrate and at least one coil formed by a strip of a specified pattern of conductive layer provided on the first surface of the substrate, a band-pass filter is provided on a second surface and having an input terminal and an output terminal provided on the first surface of the substrate, a first grounding conductive layer provided on substantially the whole part of the first surface of the substrate excluding small areas for passing an input terminal and an output terminal for the band-pass filter, a second grounding conductive layer provided on the second surface of the substrate excluding small areas for passing an input and output terminal for the band-pass filter, through-holes with a connection conductor therein provided between the low-pass filter and the terminals of the band-pass filter thereby connecting the first grounding conductive layer and the second grounding conductive layer.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENTS

The structure of a preferred embodiment of a filter apparatus in accordance with the present invention is described in detail with reference to FIGS. 4 and 5.

Figure 1:
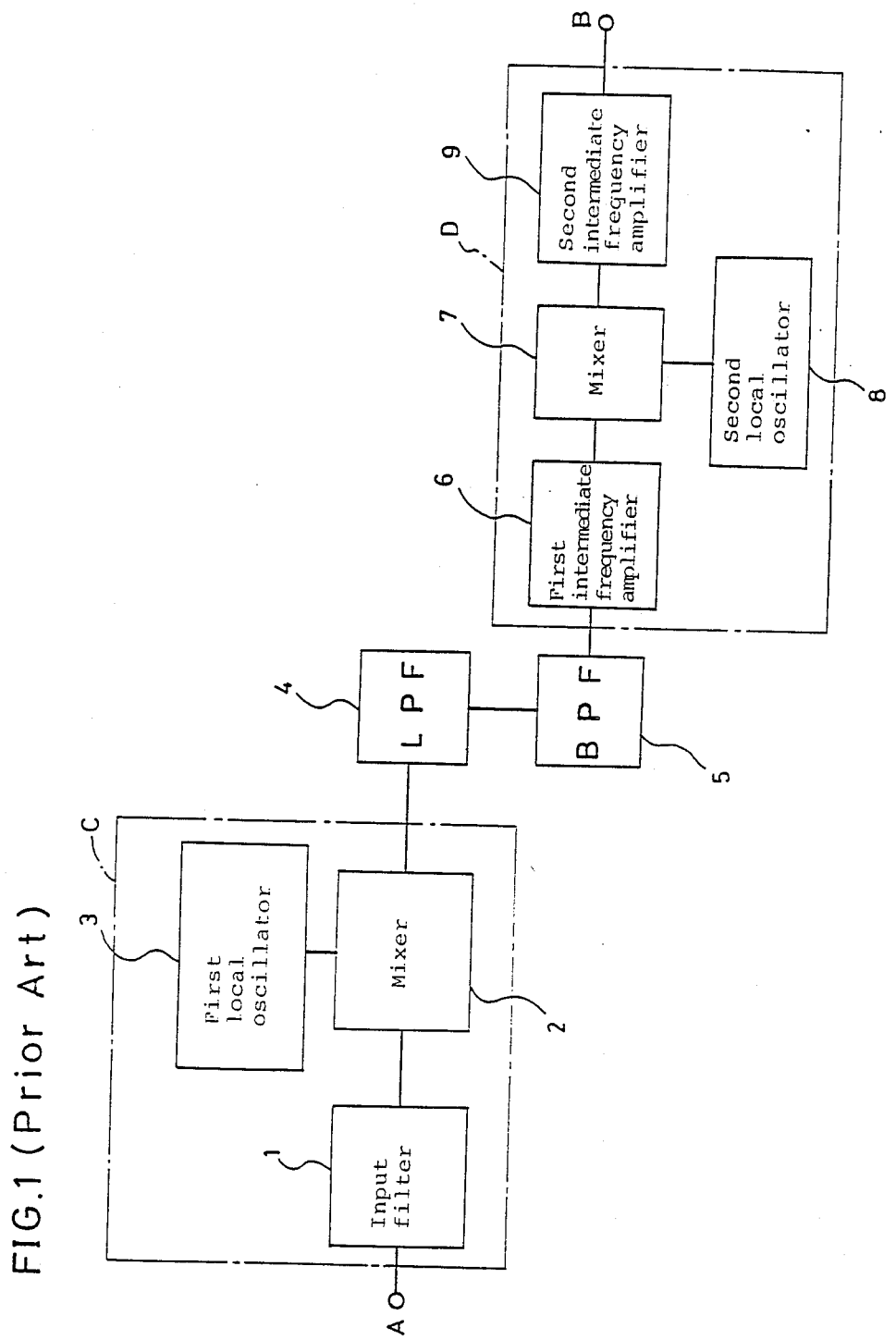
FIG. 1 is the system block diagram of a prior art converter.
Figure 2A:
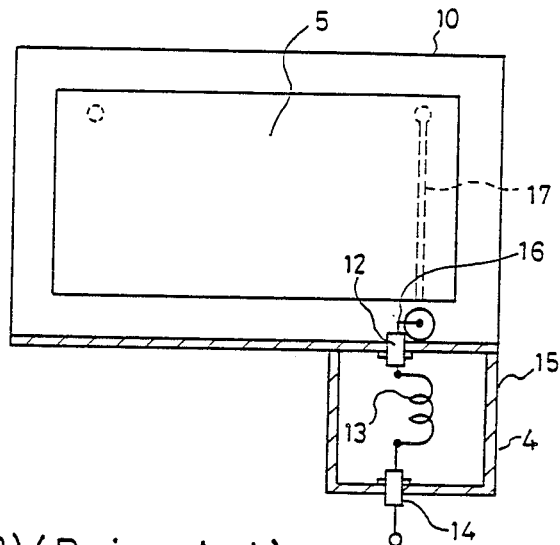
FIG. 2A is a plan view of a low-pass filter of the prior art.
Figure 2B:
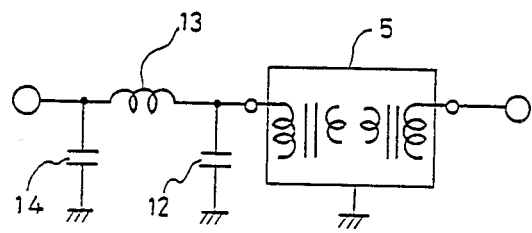
FIG. 2B is the circuit diagram of a low-pass filter and a band-pass filter of the prior art.
Figure 2C:
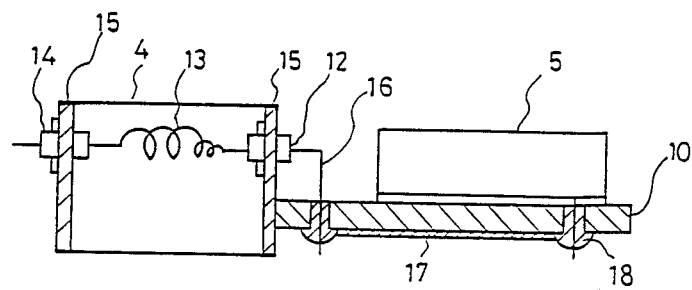
FIG. 2C is a sectional view of the low-pass and band-pass filters of the prior art.
Figure 3A:
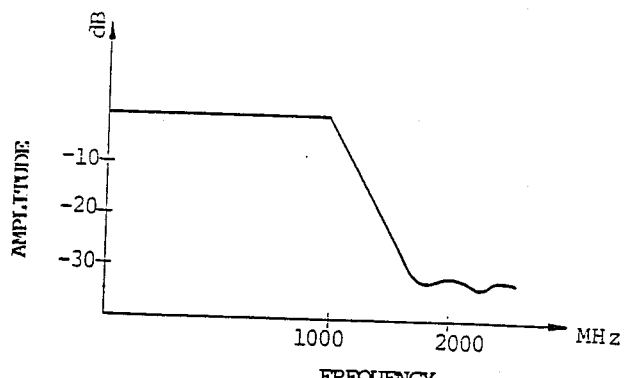
FIG. 3A is a graph showing the characteristic of the low-pass filter of the prior art.
Figure 3B:
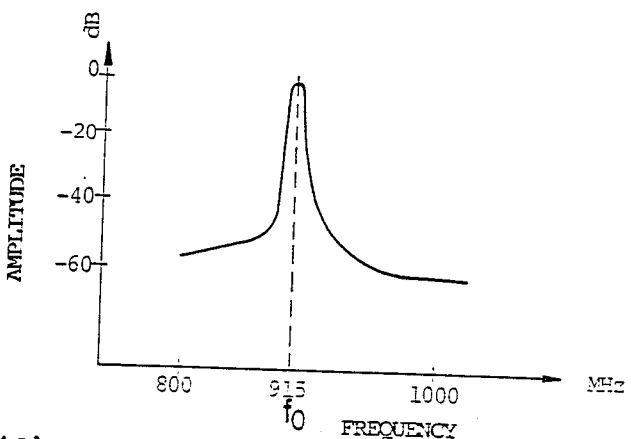
FIG. 3B is a graph showing the characteristic of the band-pass filter of the prior art.
Figure 3C:
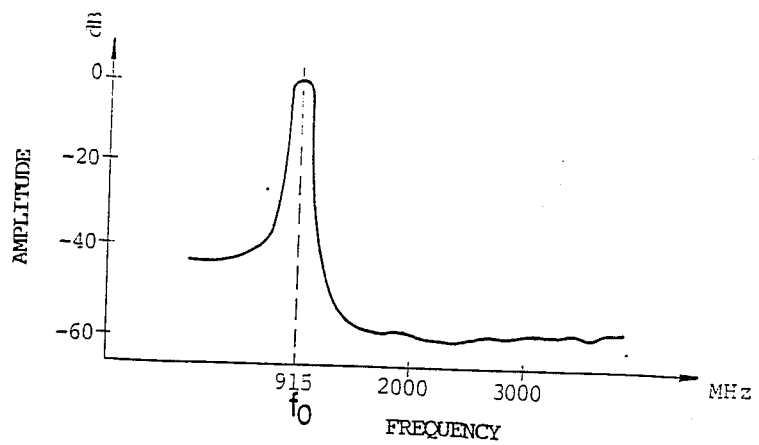
FIG. 3C is a graph showing a combination characteristic of a low-pass filter and a band-pass filter.
Figure 4A:
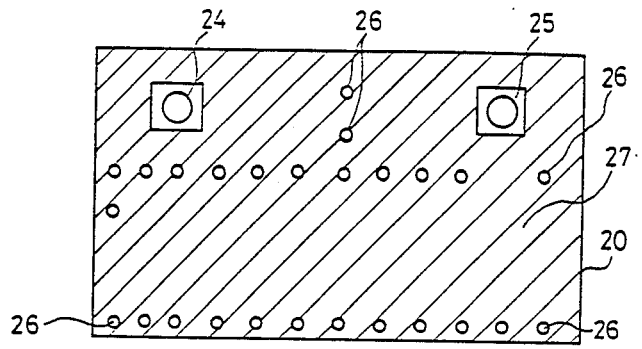
FIG. 4A is a conductive layer pattern on a front surface of a substrate, according to an embodiment of the present invention.
Figure 4B:
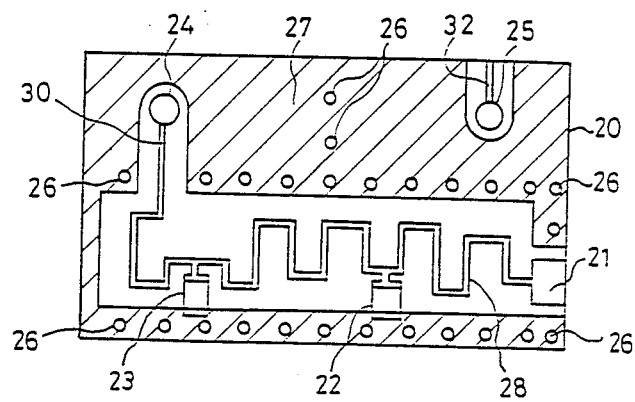
FIG. 4B is a conductive layer pattern on a rear surface of the substrate of FIG. 4A.
Figure 4C:
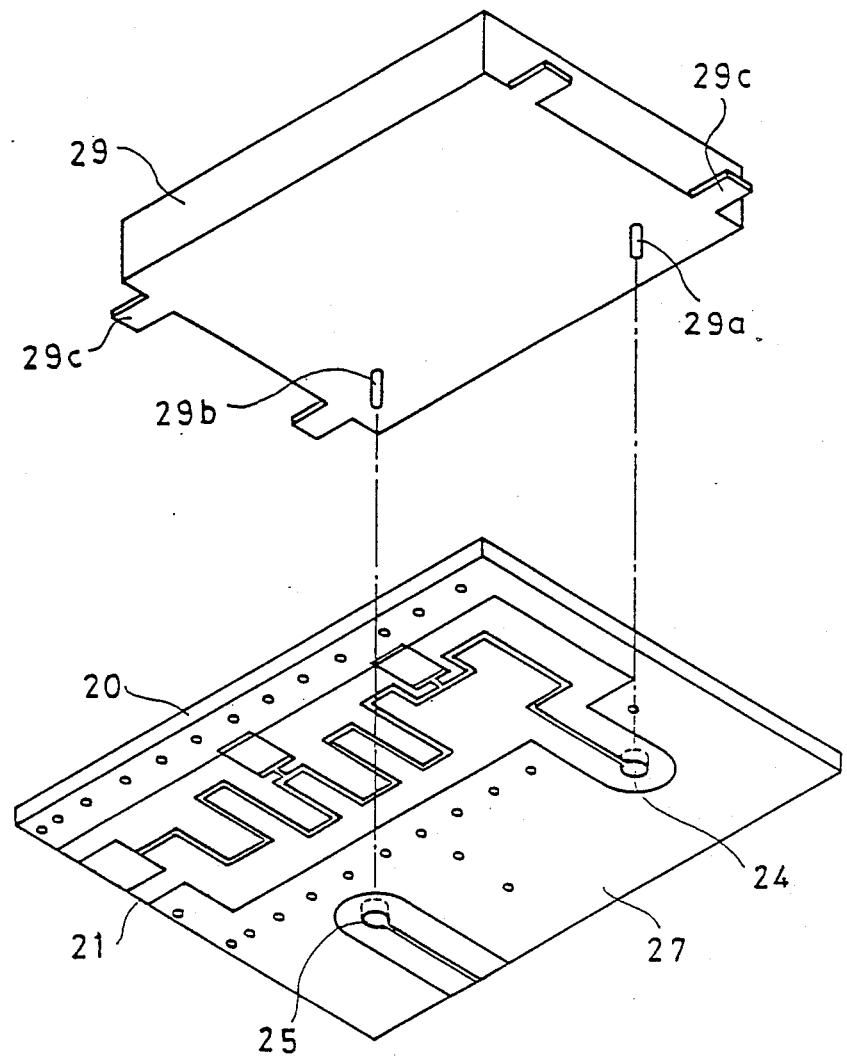
FIG. 4C is a exploded view of a filter apparatus of the embodiment of an present invention.
Figure 5:
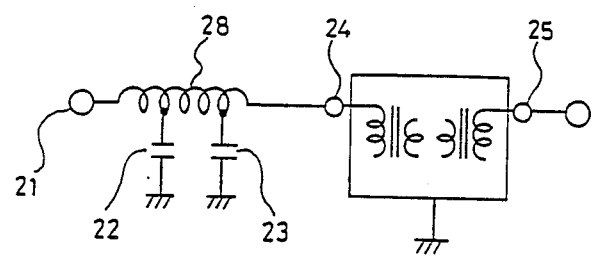
FIG. 5 is a circuit diagram of the filter apparatus of the embodiment of an present invention.

FIG. 4A shows a pattern of conductive layer on a front surface of a substrate. FIG. 4B shows a pattern of conductive layer on a reverse surface of the substrate. FIG. 4C shows a exploded view of the filter apparatus. FIG. 5 shows a circuit diagram of a low-pass filter and a band-pass filter. In this embodiment, a dielectric filter of coaxial resonance type is used as band-pass filter.

As shown in FIG. 4A and in FIG. 4C an input terminal 24 and an output terminal 25 are provided on a first surface of the substrate 20. A conductive layer 27 for grounding is formed on substantially the entire first surface of the substrate 20 exclusing areas for the input terminal 24 and output terminal 25 of the band-pass filter 29. This conductive layer 27 operates as shield plate. Connecting a ground terminal 29c of the band-pass filter 29 to this conductive layer 27 improves the passband response of the band-pass filter 29.

FIG. 4B shows a layer pattern of the back side of the substrate 20. The input terminal 24 and output terminal 25 appear on one side of the back side of the substrate 20. From the input terminal 24 and output terminal 25, strips of conductive layers 30, 32 for input and output are extended. The conductive layers 30, 32 for input and output, respectively, are formed as strip-type a transmission line because the shielding conductive layer 27 is provided on the first surface of the substrate 20 as shown in FIG. 4A. In FIG. 4B, on the reverse surface of the substrate 20, the low-pass filter is provided. The low-pass filter consists of an input terminal 21, a coil 28 formed by printed layer and capacitors 22, 23. On one side of the reverse surface, of substrate 20 a conductive layer 27 for grounding is formed excluding areas for passing input terminal 24 and output terminal 25. A row of through-holes 26 with connecting conductors therein are provided to surround the low-pass filter and for connecting both the conductive layers 27 on the first surface and the reverse surface, and a further row of through-holes 26 are provided between the input and output terminals 24, 25 so as to shield them each other. The pitch of the through holes is preferably 2 mm in this embodiment where a thickness of the substrate is 0.8 mm. The through-holes shield the leakage of the signal between the low-pass filter and the band-pass filter.

Figure 6A:
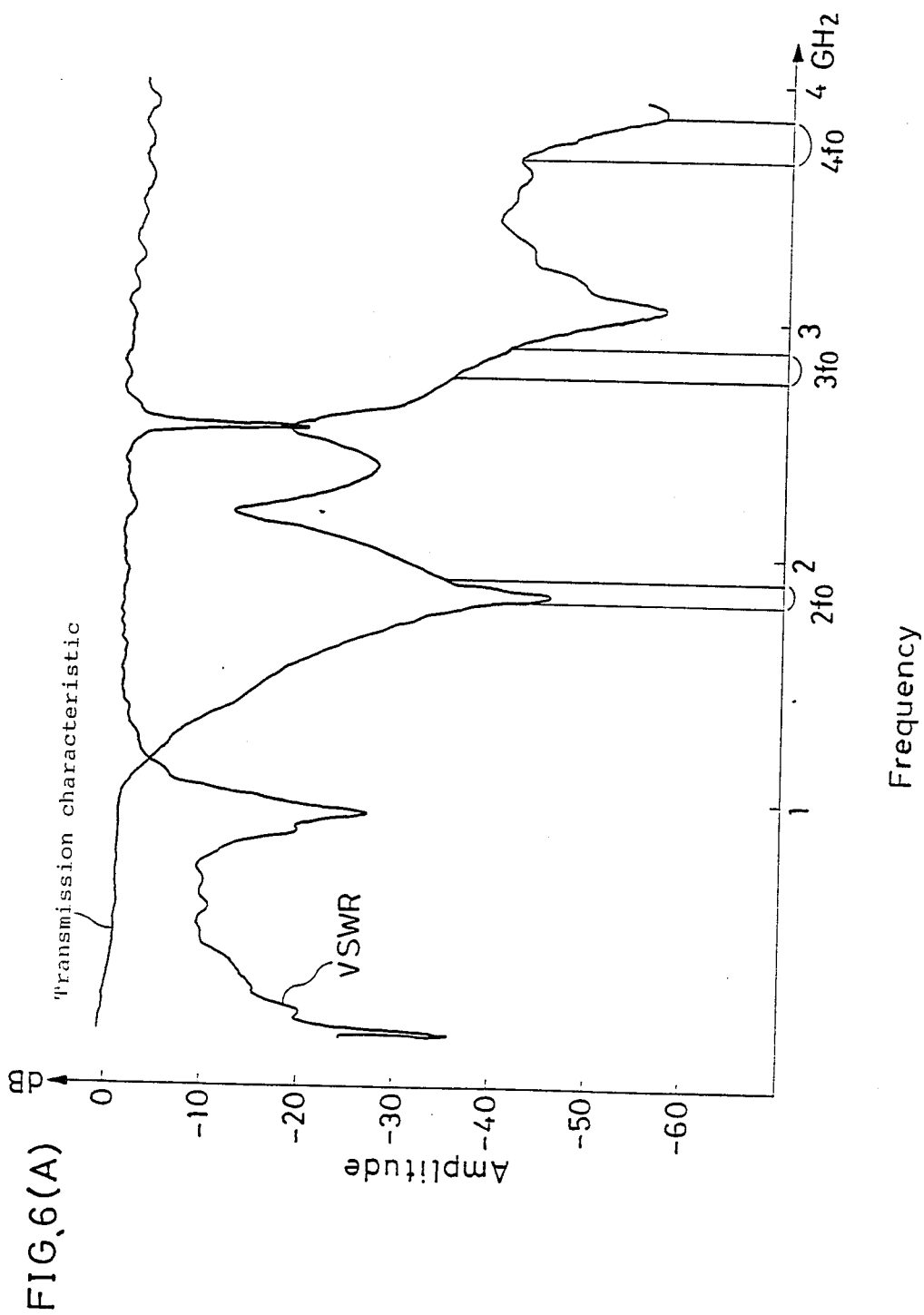
FIG. 6A is the graph showing the characteristic of the low-pass filter of the embodiment of the present invention.
Figure 6:
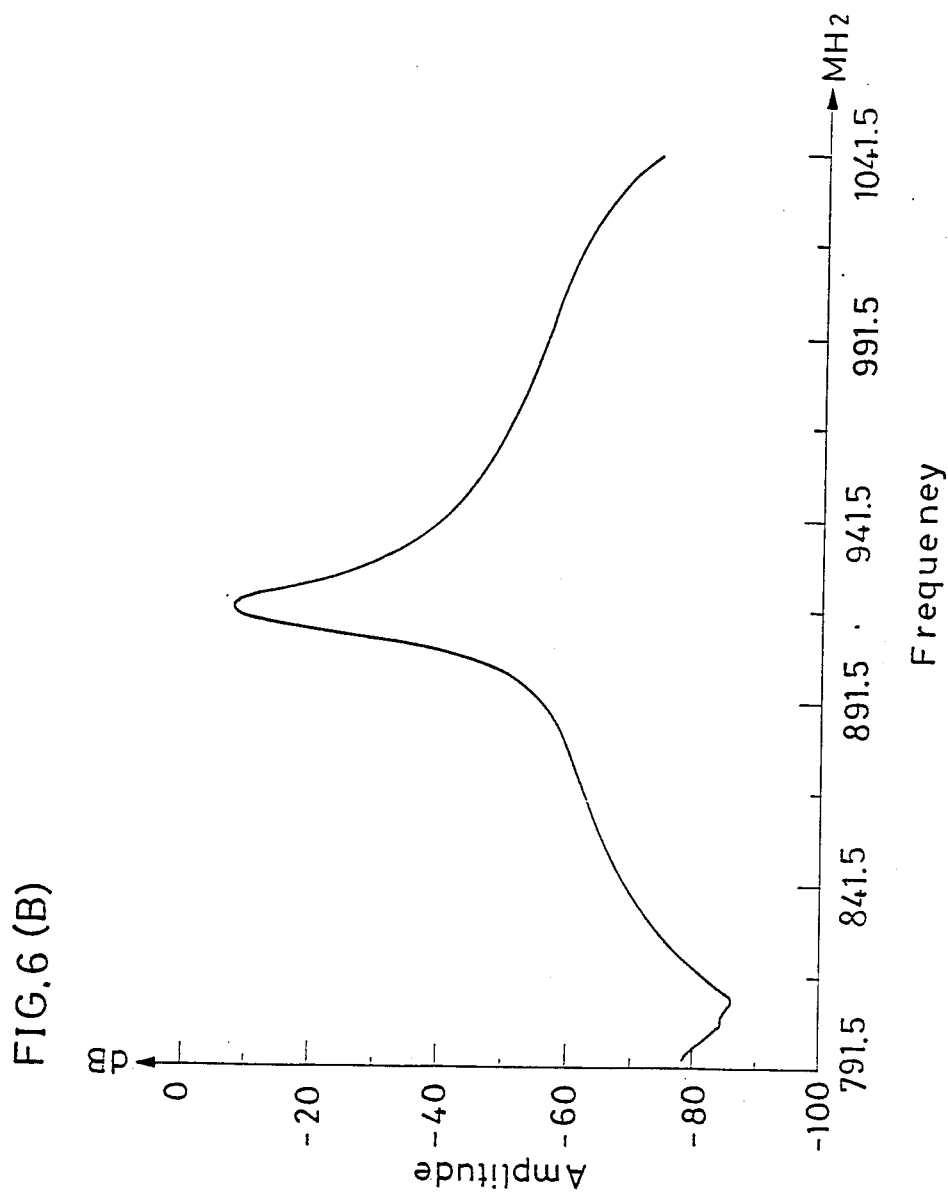
FIG. 6B is the graph showing the characteristic of the band-pass filter of the embodiment of an present invention.
FIG. 6C is a graph showing a combination characteristic of the low-pass filter and the band-pass filter.
Figure 6C:
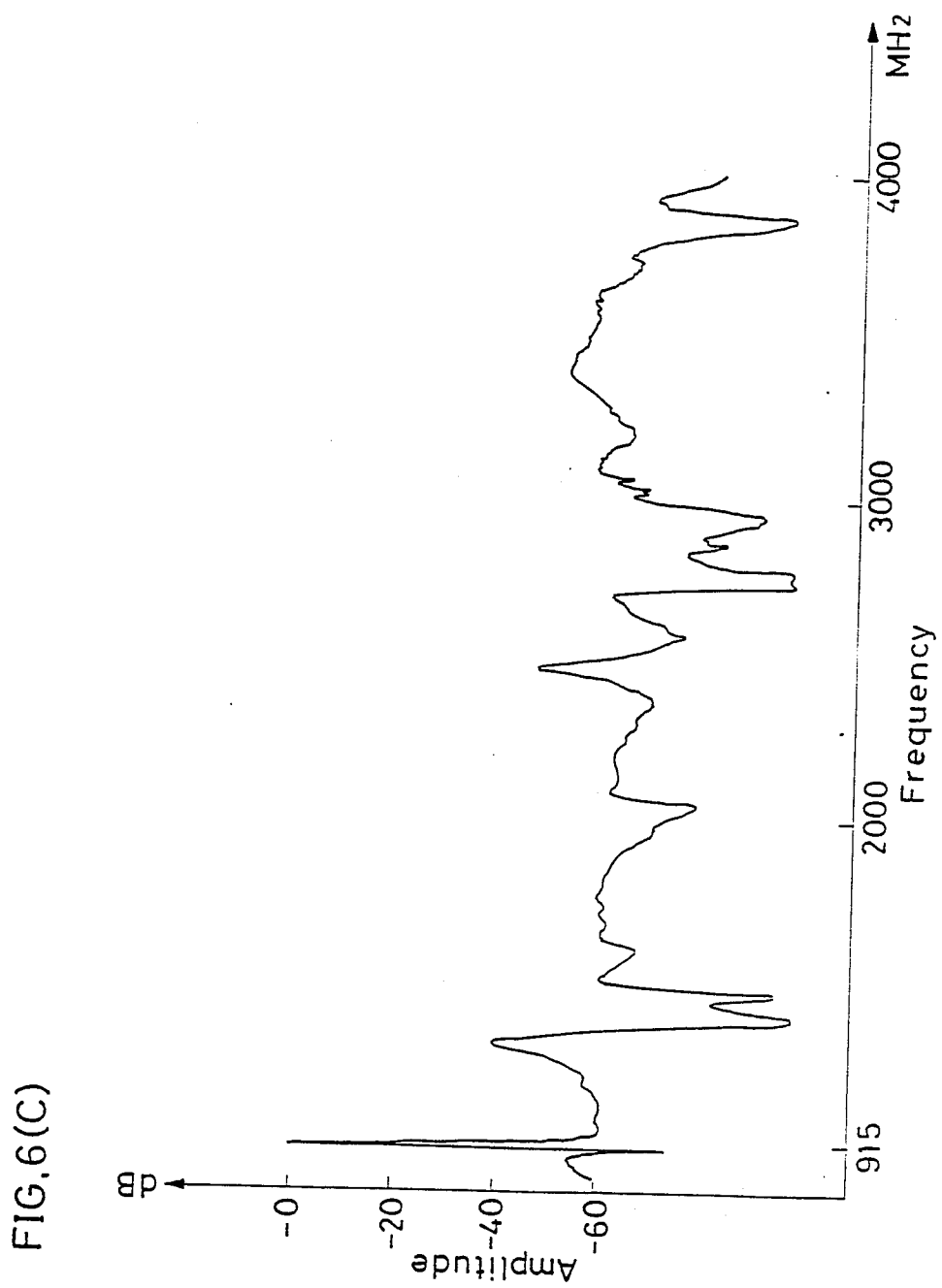

In this embodiment, the low-pass filter 4 has a characteristic as shown in FIG. 6A and the band-pass filter 5 has a characteristic as shown in FIG. 6B. A combination characteristic of the low-pass filter and the band-pass filter is as shown in FIG. 6C.

According to the present invention, the filter apparatus in accordance with the present invention, attenuation outside the bandwidth becomes 40 dB or over, as a result of introducing the grounding conductive layer 27 and the through holes 26. Therefore, interference by the local oscilation frequency can be substantially prevented. Further, the production steps become simplified and the filter apparatus becomes compact, as a result of forming the printed conductive layer on one surface of the substrate and forming the band-pass filter on the other surface.

Although the invention has been described in its preferred embodiment with a certain degree of particularity, it is understood that the present disclosure of the preferred embodiment can be changed in the details of construction and other combinations and arrangements of parts may be resorted to without departing from the spirit and the scope of the invention as hereinafter claimed.

What is claimed is:

1. A filter apparatus comprising:
    a substrate of insulating material;
    a low-pass filter provided on a first surface of said substrate having an input terminal, an output terminal, at least one capacitor and at least one coil formed by a strip of specified pattern of a conductive layer provided on said first surface of the substrate;
    a band-pass filter provided on a second surface of said substrate having an input terminal and an output terminal disposed on the first surface of the substrate, wherein said input terminal of said band-pass filter is connected to said output terminal of said low-pass filter;
    a first grounding conductive layer provided over substantially the entire first surface of said substrate excluding a portion thereof containing said low-pass filter and small portions thereof surrounding said input terminal and said output terminal of the band-pass filter;
    a second grounding conductive layer underlying said band-pass filter and provided on substantially the entire second surface of the substrate excluding small portions thereof surrounding said input and output terminals of the band-pass filter; and
    a plurality of through-holes provided in said substrate and having conductor means disposed therein for connecting said first grounding conductive layer and the second grounding conductive layer.

2. A filter apparatus in accordance with claim 1, wherein said through-holes are disposed in rows so as to surround said low-pass filter.

3. A filter apparatus in accordance with claim 1, wherein said through-holes are disposed in a row between the input terminal and the output terminal of said band-pass filter.

4. A filter apparatus in accordance with claim 1, wherein said through-holes are provided in a row surrounding said low-pass filter and are also disposed in a row between the input terminal and the output terminal of said band-pass filter.

5. A filter apparatus in accordance with claim 1, wherein said band-pass filter comprises a dielectric filter of coaxial resonance type.

6. A filter apparatus in accordance with claim 5, wherein said through-holes are disposed in the form of a row so as to surround said low-pass filter.

7. A filter apparatus in accordance with claim 5, wherein said through-holes are disposed in the form of a row between the input terminal and the output terminal of said band-pass filter.

8. A filter apparatus in accordance with claim 5, wherein said through-holes are provided in a row surrounding said low-pass filter and are disposed in a row between the input terminal and the output terminal of said band-pass filter.

* * * * *